United States Patent
Zhong et al.

(10) Patent No.: US 7,345,254 B2
(45) Date of Patent: Mar. 18, 2008

(54) DIE SORTING APPARATUS AND METHOD

(75) Inventors: Wei Min Zhong, Hong Kong (CN); Yang Yang, Hong Kong (CN); Choo Han Loh, Hong Kong (CN); Keung Chau, Hong Kong (CN)

(73) Assignee: ASM Assembly Automation Ltd., Hong Kong (HK)

( * ) Notice: Subject to any disclaimer, the term of this patent is extended or adjusted under 35 U.S.C. 154(b) by 97 days.

(21) Appl. No.: 11/006,928

(22) Filed: Dec. 8, 2004

(65) Prior Publication Data

US 2005/0130333 A1   Jun. 16, 2005

Related U.S. Application Data

(60) Provisional application No. 60/528,448, filed on Dec. 9, 2003.

(51) Int. Cl.
*G06K 9/00* (2006.01)
(52) U.S. Cl. .................. 209/571; 382/145; 382/151
(58) Field of Classification Search ........ 209/571–574, 209/939; 700/121, 223; 382/145, 151
See application file for complete search history.

(56) References Cited

U.S. PATENT DOCUMENTS

| | | | | |
|---|---|---|---|---|
| 5,219,765 A | * | 6/1993 | Yoshida et al. | 438/10 |
| 5,848,705 A | * | 12/1998 | Gianpaolo et al. | 209/571 |
| 5,892,686 A | * | 4/1999 | Iijima | 700/121 |
| 5,913,105 A | * | 6/1999 | McIntyre et al. | 438/16 |
| 6,021,380 A | * | 2/2000 | Fredriksen et al. | 702/35 |
| 6,028,664 A | * | 2/2000 | Cheng et al. | 356/237.4 |
| 6,128,403 A | * | 10/2000 | Ozaki | 382/145 |
| 6,216,055 B1 | * | 4/2001 | Balamurugan et al. | 700/121 |
| 6,756,796 B2 | * | 6/2004 | Subramanian | 324/750 |
| 7,022,533 B2 | * | 4/2006 | Farnworth et al. | 438/15 |
| 2006/0010416 A1 | * | 1/2006 | Keck et al. | 716/19 |

* cited by examiner

*Primary Examiner*—Joseph C. Rodriguez
(74) *Attorney, Agent, or Firm*—Ostrolenk, Faber, Gerb & Soffen, LLP

(57) ABSTRACT

A die sorting apparatus for a wafer is provided that associates logical positions of each die from a map file for storing records of testing information based upon testing performed on individual dice comprised in the wafer with its physical position as illustrated by an image acquired by an image capturing device showing physical positions of the dice, after the dice have been singulated. A processing device can thus determine actual physical positions of the dice for reference by a die pick-up device configured to selectively pick up dice that meet predetermined criteria according to the testing information from their actual physical positions as determined.

19 Claims, 4 Drawing Sheets

DIE SORTING APPARATUS AND METHOD

RELATED APPLICATIONS

This application claims the benefit of U.S. Provisional Application Ser. No. 60/528,448, filed Dec. 9, 2003, entitled DIE SORTING APPARATUS AND METHOD.

FIELD OF THE INVENTION

The invention relates to a die sorter for sorting a collection of semiconductor dice comprised in a semiconductor wafer according to tests conducted on the dice, and in particular, it can be utilized for selectively picking dice of a certain quality from the semiconductor wafer.

BACKGROUND AND PRIOR ART

The application of semiconductor chips or dice in the manufacture of light-emitting diodes ("LEDs") has grown tremendously in recent years and the requirement for homogeneity is an important one. Die sorting has become essential especially for semiconductor dice used in applications like displays and lightings. Dice are sorted according to their electrical properties, light intensity, and frequency. Probing to conduct electrical tests on the dice is done either before or after the wafer is singulated or cut into individual dice.

The wafer is usually mounted onto Mylar film and singulation is done on the film. If a wafer is probed before it is singulated, a map file containing the relative logical position and grade of each die will be generated. A mapping sorter will then sort the wafer into different grades of dice according to the map after the wafer is singulated into individual dice. After aligning a die on the physical wafer with the corresponding die on the wafer map, the mapping sorter can start the sorting process. Generally, the position of the next die to be picked will be calculated from its relative wafer map position to the present die and the learnt die pitch of the wafer.

U.S. Pat. No. 6,021,380 entitled "Automatic Semiconductor Wafer Sorter/Prober with Extended Optical Inspection" discloses an automated semiconductor wafer sorter/prober for visually inspecting and sorting semiconductor wafers. Its approach is to obtain a wafer image before probing so that the probe will not be probing at places with no dice, partial dice, or visually defective dice. This is to increase the probing efficiency and to prevent the probes from getting damaged. It also mentions that the system can be used for inspection after the wafer has been singulated and the resulting wafer map can be used for pick-and-place assembly operations. However, it fails to take into account factors such as misalignment of dice or damage to the wafer after singulation of the wafer by a cutting tool. Since it does not record the relative actual physical locations of the dice after singulation of the wafer, it has to pick up dice by relying on the learnt pitch throughout the die pick-up process.

Moving from one die to the next relying on the learnt pitch poses no problems under normal circumstances when the dice are arranged in a regular array. However, this method is unreliable after singulation of the dice. If the next die is far away (for example, dice are missing in between) or the expansion of the Mylar film is uneven, the calculated location of the next die could fall on a wrong physical die (it could be a die in the next row or the next column). If just one die is missed or incorrectly detected, the rest of the dice could be sorted erroneously. The same thing could happen if part of the wafer is damaged after singulation and there are no alignable dice in a certain area.

SUMMARY OF THE INVENTION

It is thus an object of the invention to seek to improve the efficiency of a die sorting and pick-up operation and to avoid some of the disadvantages of the above prior art.

According to a first aspect of the invention, there is provided a die sorting apparatus for a wafer, comprising: a map file for storing records of testing information based upon testing performed on individual dice comprised in the wafer and their relative logical positons; an image capturing device for acquiring a image showing physical positions of the individual dice after the dice have been singulated; a processing device operative to associate the logical positions of each die from the map file with its physical position as illustrated by the image of the singulated dice to determine the actual physical position of the die; and a die pick-up device configured to selectively pick up dice that meet predetermined criteria according to the testing information from their actual physical positions as determined by the processing device.

According to a second aspect of the invention, there is provided a method of sorting a wafer including singulated dice, comprising the steps of: providing a map file containing records of testing information based upon testing performed on individual dice comprised in the wafer and their relative logical positions; acquiring an image of the wafer after the dice have been singulated showing physical positions of the singulated dice; associating the logical positions of each die from the map file with its physical position as illustrated by the image of the singulated dice; determining the actual physical position of each die; and thereafter selectively pick up dice that meet predetermined criteria according to the testing information from their actual physical positions as determined.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a die sorting apparatus and method according to the preferred embodiment of the invention will now be described with reference to the accompanying drawings, in which.

DETAILED DESCRIPTION OF THE PREFERRED EMBODIMENT

Figure 1:
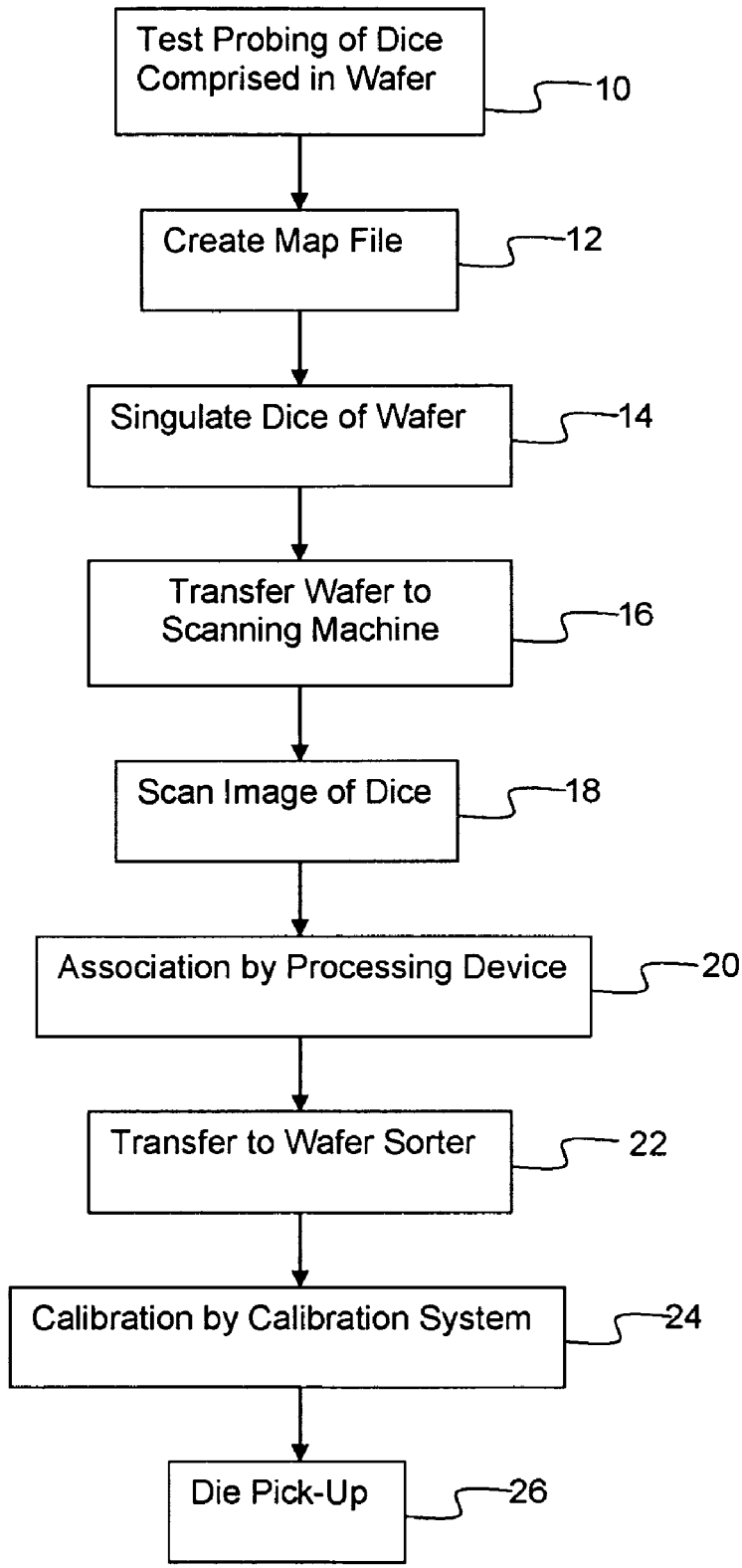
FIG. 1 gives a general overview of the processes involve in a die testing process up to a die pick-up process according to the preferred embodiment of the invention, wherein dice meeting predetermined criteria are removed from the wafer.

FIG. 1 gives a general overview of the processes involve in a die testing process up to a die pick-up process according to the preferred embodiment of the invention. Testing information is obtained on the dice through testing probing of dice comprised in the wafer 10. A map file is then created 12 based upon each die's logical position and its testing information. After the map file is created, the dice of the wafer may be singulated 14 in preparation for removal from the wafer.

The singulated wafer may then be transferred to a scanning machine 16. The scanning machine scans an image of the dice 18 to obtain their physical positions. With this image, a processing device associates logical positions of the dice with their actual physical positions 20. After such association, the wafer comprising the singulated dice is transferred to a wafer sorter 22.

Thereafter, a calibration system calibrates the wafer sorter to the image of the dice obtained earlier 24. After calibration, the die pick-up device picks up and removes dice meeting predetermined criteria from the wafer 26. The above processes will be described in further detail below.

Figure 2:
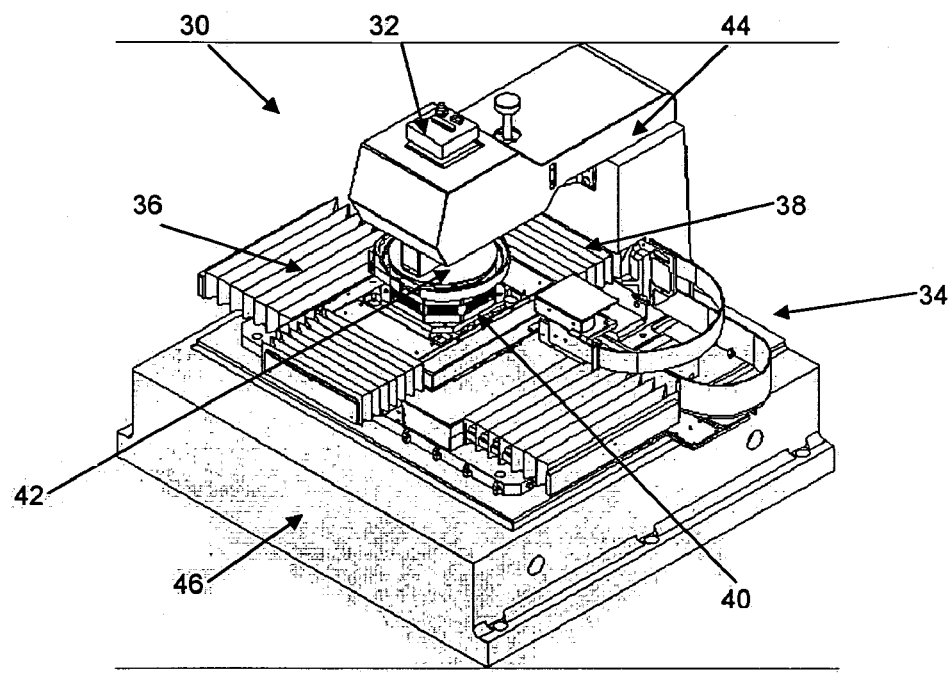
FIG. 2 is an isometric view of a scanning machine that is usable with the die sorting apparatus according to the preferred embodiment of the invention.

FIG. 2 is an isometric view of an image-capturing machine in the form of a scanning machine 30 that is usable with the die sorting apparatus according to the preferred embodiment of the invention. The scanning machine 30 generally comprises an image scanner, such as a line scan camera 32, and a positioning device, such as an XYθ table 34. The XYθ table 34 may comprise an X-axis linear motor 36, a Y-axis linear motor 38 and a pancake motor 40. The line scan camera 32 is attached via an optics mount 44 to a main base 46.

An expanded singulated wafer placed on a ring having adhesive Mylar film (not shown) is mounted on a wafer holder 42 on the XYθ table 34 under the line scan camera 32. Before the full scanning process, a slice 54 of the wafer (see FIG. 5) is preferably scanned to get the image of some dice. From the image of the slice of wafer, the pattern of a die is learnt and can be used as a basis for recognizing other dice. A map file from a probing machine containing testing or probing information that was previously obtained will be loaded into the scanning machine 10, or is otherwise accessible by the scanning machine 10.

Figure 3:
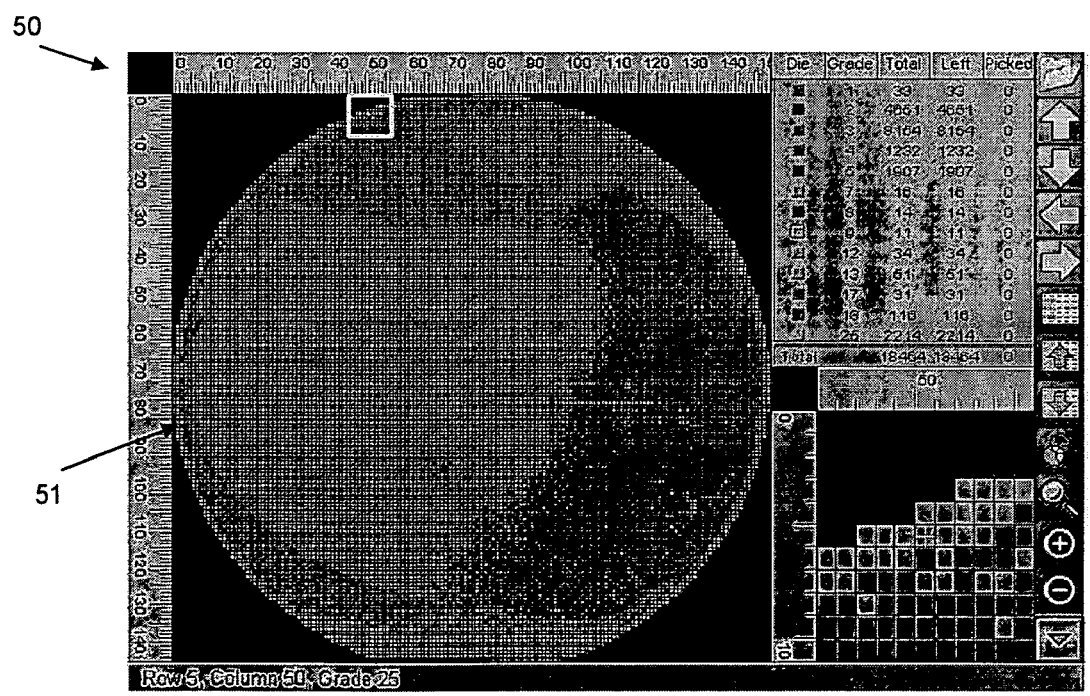
FIG. 3 shows an exemplary probing information map file of a wafer obtained from a probing machine.

FIG. 3 shows an exemplary probing information map file 51 of a wafer obtained from a probing machine. The map file 51 may be graphically illustrated on a display device 50. The map file stores a relative logical position of each die together with its testing information based upon test probing performed on the die. In FIG. 3, each die is illustrated by a rectangle and the dice are illustrated as being arranged in a regular array. The dice can each be assigned a number signifying a grade, which may denote certain predefined qualities, and different grades are represented by a different colour as illustrated. The grading of each die facilitates the sorting and removal of certain dice that meet predetermined criteria in a die pick-up process.

Figure 4:
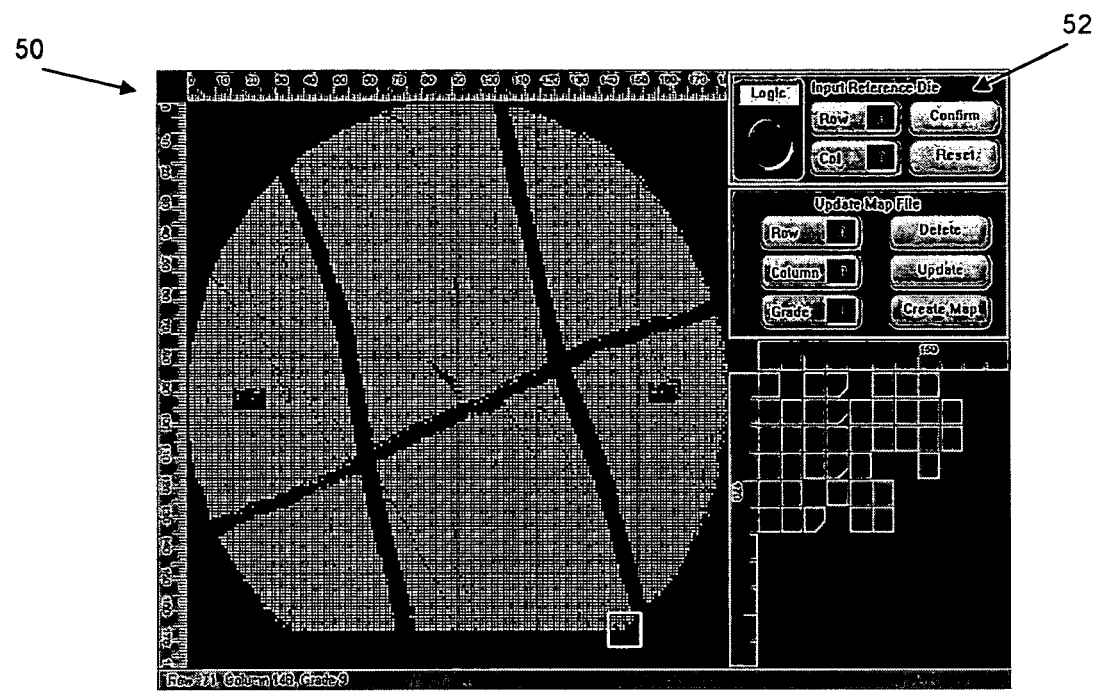
FIG. 4 shows an exemplary scanned image of a semiconductor wafer that has been singulated.

The actual wafer will then be scanned to acquire an image showing the physical positions of the singulated dice by moving the wafer under the scanner. Preferably, the line scan camera 12 scans the wafer line by line and the lines will be merged to form a single image file showing the physical positions of the dice. FIG. 4 shows an exemplary scanned image of a semiconductor wafer that has been singulated. As observed from the scanned image, the distribution of semiconductor dice is irregular, and some dice are separated by a greater distance than others. After the image has been acquired, a processing device will associate the logical positions of each die from the map file with its physical position as illustrated by the image of the singulated dice to determine the actual physical position of the die.

Preferably, the display device 50 is included to display the image generated from scanning with the line scan camera 12. In fact, after the actual physical positions of the dice have been determined by the processing device, testing information of each singulated die, such as colour information denoting a certain grade of die, may be superimposed onto each individual die. In addition, the display device 50 may preferably include a reference die selector 52 for an operator to select a reference die from the image of the singulated dice prior to processing by the processing device. By selecting a reference die that is used as a basis for relating to and recognizing other die positions, this facilitates the association of the logical positions of the dice with their physical positions.

Figure 5:
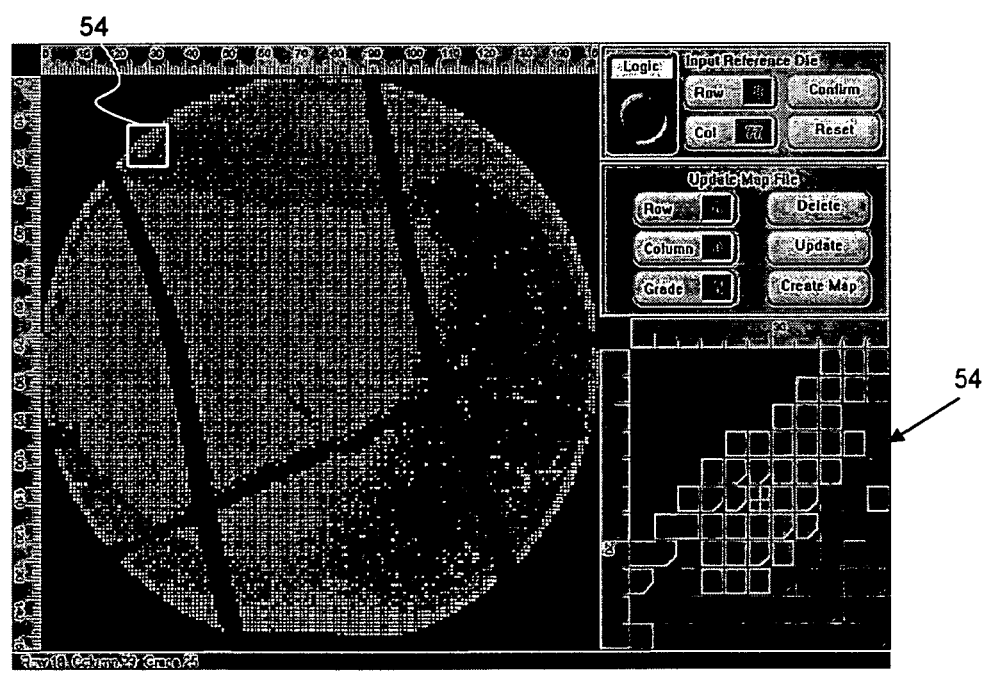
FIG. 5 shows an image with probing information from the map file of FIG. 3 matched with and mapped onto the scanned image of FIG. 4.

FIG. 5 shows an image with probing information from the map file of FIG. 3 matched with and mapped onto the scanned image of FIG. 4. The processing device comprised in the apparatus has mapped the testing or probing information from the map file onto the scanned image. A die in this image with known relative logical position in the corresponding map will be virtually marked in the system. This logical position is input into the system and the system will match the scanned image with the loaded map file 51. Hence the physical positions can be matched with the logical positions in order to know the actual physical location of each die, which is further referable to its testing information.

Figure 6:
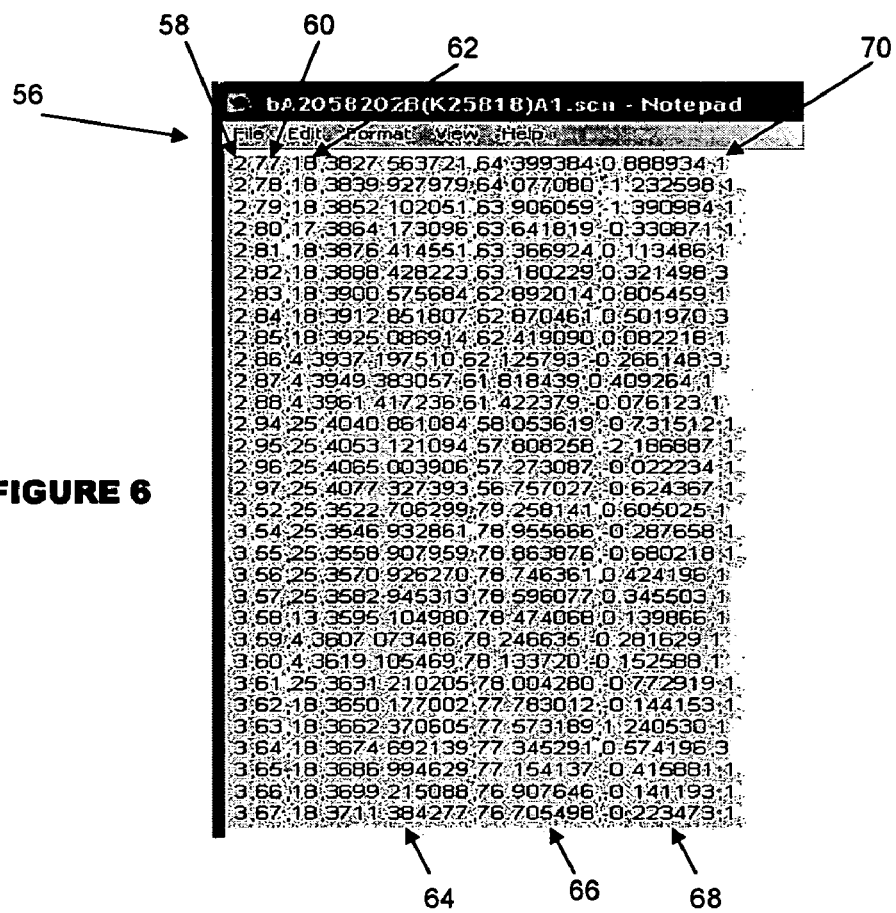
FIG. 6 shows a partial output of an output file containing information on the relative and actual physical positions of the singulated dice.

Consequently, an output file containing the matched results is generated by the processing device. FIG. 6 shows a partial output of an output file 56 containing information on the relative positions and actual physical positions of the singulated dice. It is the final output of this wafer scanner and will preferably be used by the mapping sorter and die pick-up device to pick up dice from the wafer. The columns represent the logical column 58, the logical row 60 (for indicating the logical position), the grade 62, the physical X coordinates 64, the physical Y coordinates 66, the physical theta 68 representing angular displacement (for indicating the actual physical position), and the inspection result 70 of each die respectively. Therefore, there is no necessary for the die pick-up device to deduce the actual physical position of dice from learnt pitches. The die pick-up device is able to move directly to specific dice that meet predetermined criteria and to pick them up directly from the wafer.

This file and the corresponding wafer are then transferred to a mapping sorter (not shown) comprising an XY table. Here the actual wafer and the image of the singulated dice will have to be matched again. Since the resolution of the XY table in the wafer scanner and the XY table in the mapping sorter may not be the same, calibration should preferably be done. Two dice in the physical wafer have to be matched with the image of the singulated dice. It can be done manually, or automatically if reference dice with different patterns with known logical positions are present in the wafer. With two dice identified, the physical position in the file and the actual physical position of the same die in the mapping sorter can be correlated. Hence every die in the wafer will have a known physical position corresponding to an XY table reference position in the mapping sorter.

Figure 7:
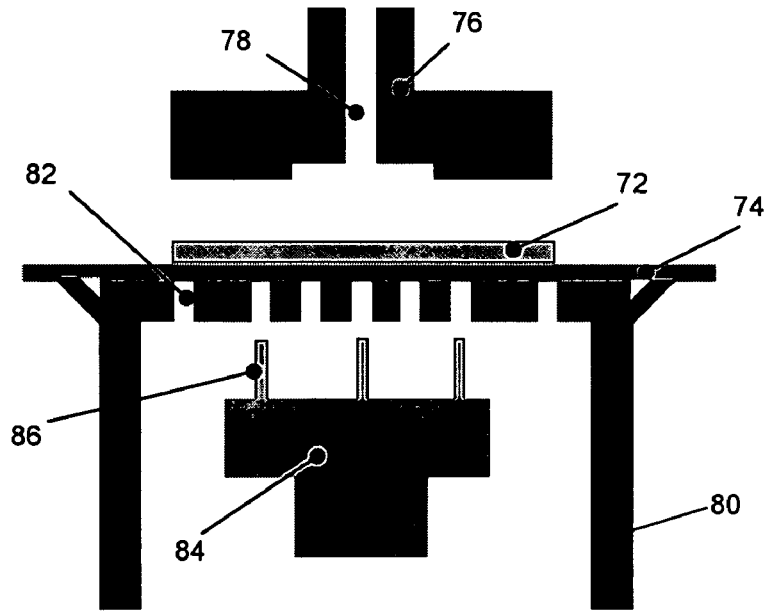
FIG. 7 is a sectional view of a die pick-up apparatus usable with the preferred embodiment of the invention.

FIG. 7 is a sectional view of a die pick-up apparatus usable with the preferred embodiment of the invention. One die 72 of the wafer is illustrated, and the die 72 is mounted on an adhesive tape 74. A die pick-up device 76 is positioned over the die 72 to be removed. The die pick-up device 76 includes a vacuum channel 78 for apply suction to hold the die 72. Underneath the adhesive tape 74, a die ejector platform 80 is positioned below the die 72. Vacuum holes 82 in the die ejector platform 80 apply vacuum suction generated from within the die ejector platform 80 to hold the adhesive tape 74.

A die ejector 84 comprising ejector pins 86 is located inside the die ejector platform 80. The die ejector 84 is vertically movable such that the ejector pins 86 are configured to protrude from the vacuum holes 82 when the die ejector 84 is raised. The protrusion of the ejector pins 86 lifts the die 72 and adhesive tape 74 to promote delamination between the die 72 and the adhesive tape 74. Once the die 72 is sufficiently delaminated, the die pick-up device 76 may be lowered onto the die 72 to pick it up and remove it from the adhesive tape 74. The above describes one type of die pick-up apparatus that is usable with the invention. It should be appreciated that other designs may also be suitable for use.

With the physical location of every die known, the risk of the die pick-up device being moved to the wrong position due to, for example, two consecutive good dice being too far apart can be substantially reduced. That means wafer with holes or missing dice can be handled easily. This gives flexibility to the sorting process. In the present state of the art, even if only certain grades in a wafer are needed, the whole wafer has to be sorted through to avoid leaving holes in the wafer. With the described embodiment of the invention, only dice that are needed will be taken out from the wafer. This will greatly improve the efficiency. The efficiency of the sorting is further improved as no time will be wasted in searching for the next die that may not be there. This embodiment can also handle wafers broken while being singulated into individual dice. Each piece of the broken wafer could have its own map generated and can be sorted accordingly, just like the good dice.

The invention described herein is susceptible to variations, modifications and/or additions other than those specifically described and it is to be understood that the invention includes all such variations, modifications and/or additions which fall within the spirit and scope of the above description.

The invention claimed is:

1. A die sorting apparatus for a wafer, comprising:
a map file for storing records of testing information based upon testing performed on individual dice in the wafer and relative logical positions of the dice;
an image capturing device operative to acquire an image of at least a portion of the wafer comprising at least two individual dice, wherein the image shows physical coordinates of the at least two individual dice after the dice have been singulated;
a processing device operative to associate the logical position of each of the individual dice from the map file with the physical coordinates of each of the at least two individual dice as calculated from the image of the wafer and to generate a data file based on the association of the logical position and the physical coordinates of each of the dice, the data file storing the actual physical coordinates and the relative logical positions of each of the dice comprised in the at least the portion of the wafer; and
a die pick-up device operative to selectively pick up dice that meet predetermined criteria according to the testing information from their actual physical positions as contained in the data file generated by the processing device.

2. The die sorting apparatus as claimed in claim 1, including a wafer sorter to which the wafer is transferable, wherein the die pick-up device is operable to remove the dice from the location of the wafer sorter.

3. The die sorting apparatus as claimed in claim 2, including a calibration system to calibrate the wafer sorter against the image by calibrating a resolution of the wafer sorter against actual physical coordinates of the dice for reference by the die pick-up device.

4. The die sorting apparatus as claimed in claim 1, including a display device operable to display the image and to superimpose on at least one die shown in the image testing information for the at least one die.

5. The die sorting apparatus as claimed in claim 4, including a reference die selector operable by an operator to select a reference die from the image prior to processing by the processing device for facilitating association of the logical positions of the dice with the physical coordinates of the dice.

6. The die sorting apparatus as claimed in claim 1, wherein the data file generated by the processing device is an output file comprising testing information of the dice and the actual physical coordinates of the dice referable by the die pick-up device.

7. The die sorting apparatus as claimed in claim 1, wherein the actual physical coordinates of each die includes information regarding an X coordinate, a Y coordinate and an angular displacement of each die.

8. The die sorting apparatus as claimed in claim 1, wherein the map file comprises testing information obtained from test probing of the individual dice in the wafer before the wafer is singulated.

9. The die sorting apparatus as claimed in claim 1, wherein the testing information comprises grades and/or electrical properties of the dice.

10. A method of sorting a wafer including singulated dice, comprising the steps of:
providing a map file containing records of testing information based upon testing performed on individual dice in the wafer and relative logical positions of the dice;
acquiring an image of at least a portion of the wafer comprising at least two individual dice after the dice have been singulated, the acquired image showing physical coordinates of the at least two individual singulated dice;
associating the logical positions of each of the individual dice from the map file with the physical coordinates of each of the at least two individual dice as calculated from the image;
generating a data file based on the association of the logical position and the physical coordinates of each of the dice, the data file storing the actual physical coordinates and the relative logical positions of each of the dice comprised in the at least the portion of the wafer; and thereafter
selectively picking up dice that meet predetermined criteria according to the testing information from the actual physical coordinates contained in the data file.

11. The method as claimed in claim 10, further comprising a step of capturing an image of a slice of the wafer for learning a pattern of at least one die to recognize the pattern among the dice prior to acquiring the image of the whole wafer.

12. The method as claimed in claim 10, further comprising a step of displaying the image on a display device with testing information for at least one die superimposed onto a portion of the image showing the at least one die.

13. The method as claimed in claim 12, including a step of selecting a reference die from the image for facilitating association of the logical positions of the dice with the physical coordinates of the dice.

14. The method as claimed in claim 10, wherein the data file generated by the step of generating the data file comprises generating an output file comprising records of testing information of the dice and the respective physical coordinates referable by the die pick-up device.

15. The method as claimed in claim 10, wherein the actual physical coordinates of each die includes information regarding an X coordinate, a Y coordinate and an angular displacement of each die.

16. The method as claimed in claim 10, including a step of transferring the wafer to a wafer sorter prior to picking up dice with the die pick-up device.

17. The method as claimed in claim 16, further comprising a step of calibrating a mapping sorter against the image by calibrating a resolution of the mapping sorter against the actual physical coordinates of the dice.

18. The method as claimed in claim 10, wherein the map file comprises testing information obtained from test probing of the individual dice in the wafer before the wafer is singulated.

19. The method as claimed in claim 10, wherein the testing information comprises grades and/or electrical properties of the dice.

* * * * *